(12) United States Patent
Tonomura

(10) Patent No.: US 6,949,707 B1
(45) Date of Patent: Sep. 27, 2005

(54) PERIODIC INTERLEAVED STAR WITH VIAS ELECTROMAGNETIC BANDGAP STRUCTURE FOR MICROSTRIP AND FLIP CHIP ON BOARD APPLICATIONS

(75) Inventor: Samuel D. Tonomura, Rancho Palos Verdes, CA (US)

(73) Assignee: Raytheon Company, Waltham, MA (US)

( * ) Notice: Subject to any disclaimer, the term of this patent is extended or adjusted under 35 U.S.C. 154(b) by 227 days.

(21) Appl. No.: 10/800,173

(22) Filed: Mar. 11, 2004

Related U.S. Application Data

(63) Continuation-in-part of application No. 10/794,491, filed on Mar. 5, 2004.

(51) Int. Cl.[7] ............................................. H05K 9/00
(52) U.S. Cl. .............................. 174/35 MS; 174/35 R; 361/816
(58) Field of Search .......................... 174/35 R, 35 MS; 361/816, 818, 800

(56) References Cited

U.S. PATENT DOCUMENTS

| | | | | |
|---|---|---|---|---|
| 4,932,755 A | * | 6/1990 | Holdridge et al. | 359/896 |
| 5,017,419 A | * | 5/1991 | Smith | 428/209 |
| 6,147,302 A | * | 11/2000 | Matsuo et al. | 174/35 R |
| 6,599,681 B2 | * | 7/2003 | Gilson | 430/321 |
| 2004/0000416 A1 | * | 1/2004 | Hou | 174/35 MS |

* cited by examiner

*Primary Examiner*—Hung V. Ngo
(74) *Attorney, Agent, or Firm*—Leonard A. Alkov; Karl A. Vick

(57) ABSTRACT

A hybrid assembly having improved cross talk characteristics includes an electromagnetic band gap (EBG) layer on a substrate having an upper surface and a lower surface and a semiconductor structure (MMIC) mounted above the EBG layer. A plurality of stars made of an EBG material are preferably printed, or deposited, on the upper surface. The EBG material has slow wave characteristics. The plurality of stars tessellates the upper surface between conductive paths. Each of the stars has a center section formed from a regular polygon, the center section having projections extending from the center section. The projections and the center section form a periphery. The periphery engages adjacent stars along the periphery. Stars are separated from adjacent stars by an interspace. Each of the stars is connected to a conductive via, in turn connected to ground potential. A conductive layer at ground potential is electrically continuous with vias used to interconnect all stars forming the EBG layer.

20 Claims, 6 Drawing Sheets

PERIODIC INTERLEAVED STAR WITH VIAS ELECTROMAGNETIC BANDGAP STRUCTURE FOR MICROSTRIP AND FLIP CHIP ON BOARD APPLICATIONS

This application is a continuation in part of parent application titled "Improved Flip Chip MMIC on Board Performance Using Periodic Electromagnetic Bandgap Structures" filed Mar. 5, 2004, Ser. No. 10/794,491.

BACKGROUND OF THE INVENTION

1. Field of Invention

This invention is in the field of cross—talk suppression in a hybrid assembly at microwave frequencies.

2. Description of the Related Art

Monolithic Integrated Circuits (MMIC), an example of a semiconductor structure, support many of the present generation of military and commercial radio frequency sensors and communication applications. MMICs include active devices, such as field effect transistors and bipolar transistors, passive elements such as capacitors, thin film/bulk resistors, and inductors integrated on a single semi-insulating substrate, such as Gallium Arsenide.

Hybrid technology relates to methods used for interconnecting a plurality of separate semiconductor structures, such as MMICs, to a host substrate, in single, or multi-layer configurations. In a hybrid, inter-connections between the semiconductor structures is sometimes along the surface of the host substrate. These inter-connections are frequently made using metallized paths connected to bumps (soft solder, or hard plated bumps). These bumps, located on the surface of the substrate, engage conductive pads on the semiconductor structures thus forming conductive, interconnecting paths between the host substrate and the semiconductor structures. The bumps are used as a substitute in place of wire bonds for connections. The advantage of bumps over wire bonds include the elimination of wafer backside processing steps such as wafer thinning, via formation, and metal deposition.

Another advantage to using surface bumps for interconnection purposes is the lower thermal resistance between the semiconductor structures and the host substrate. The lower thermal resistance of the bump connection is due to the relatively large surface area of contact between the host substrate and the semiconductor structures. Heat transfer is also facilitated by the large diameter and short length of the bump, as compared to a wire interconnect. Although both the bump and the wire are made of thermally conductive metal, the favorable aspect ratio of the bump and wider surface area present a lower thermal resistance as compared to a typically thin, long wire bond. The lower thermal path presented by the bump facilitates the conduction of heat away from the semiconductor structures, allowing higher power density for the semiconductor/substrate hybrid assembly, especially when using thermal bumps directly under heat sources. The higher power density allows higher performance for the hybrid.

Yet another advantage of using bumps for interconnect purposes is the elimination of parasitic effects such as capacitance, inductance and radio emissions present with wire bonds and vias. At high frequencies, the thin, long wire bonds, and the vias traversing the thickness of the substrate can be considered as antennas for the emission of electromagnetic interference. The same wires and vias present capacitance to adjacent structures, as well as an inductance to the signals transmitted by the wires.

Other advantages of bumps are their lower cost and higher reliability. Typically bump type connections can be efficiently completed using a single epoxy cure/solder reflow die-attach process. This presents fewer steps during manufacture as compared to wire bond techniques. With bump interconnect, there are no mechanical wire connections to shake loose, be intermittent or fail due to thermal cycling.

While bumps are advantageous as compared to wire inter-connections, their presence between a semiconductor structure and a host substrate presents unique electromagnetic resonance and emission packaging problems. First, there is the optimization of the vertical radio frequency interconnect transitions presented by the interface between the bumps on the host substrate and the semiconductor structure mounted thereon. Then there is the potential electromagnetic coupling effects presented at the interface between the semiconductor structure and the host substrate, as well as the host substrate opposing surfaces.

A particular difficulty introduced by the semiconductor structure mounted on the host substrate is the potential formation of electromagnetic boundaries which support unwanted, parallel plate, waveguide like (surface modes) of energy propagation. Such unwanted modes can propagate near the surface of the host substrate causing degradation in semiconductor performance because of signal interference. The degradation in semiconductor performance are caused by unwanted signal transfer among semiconductor structure inputs and outputs, affecting gain and phase response, loss of isolation between adjacent paths in multiple path/multiple channel circuit applications, and circuit instability. These negative effects are due to the introduction of unwanted coupling or feedback paths.

Maximum frequency operation of the semiconductor in the presence of these unwanted feedback paths are undesirably dependent on the dimensions of the semiconductor structure. Thus, semiconductor structures with large dimensions with respect to wavelength operating frequency present a potential difficulty. This difficulty is prevalent with fast Gallium Arsenide (GaAs) semiconductor structures mounted on a host substrate. The relatively large semiconductor size of GaAs as compared to the wavelength of the operating frequency approach the cutoff frequencies at the upper edge of the operational band. Near cutoff, the semiconductor structure may be functional, but unable to operate because the incoming signals are interfering with each other.

In the prior art, signal interference is reduced by incorporating grounded interconnect bumps strategically placed on the semiconductor structure surface to break up surface modes of energy propagation. By making direct contact to ground pads on the host substrate, the path of the surface modes is disrupted. These grounded interconnect bumps act like shields and attempt to change the path to be followed by the electromagnetic energy propagated along the surface of the host substrate. Unfortunately, because of semiconductor structure limitations and assembly requirements, this practice of using redundant ground bumps as obstacles to surface propagated electromagnetic waves results in a further increase in both semiconductor structure and substrate size, increasing weight, power consumption and reducing reliability of the resulting hybrid.

Another approach described in the parent application to reduce surface modes is to tessellate the area of the substrate located in the proximity of the semiconductor structures with multiple layers of EBG regular polygons. The limitation here is that a plurality of of EBG layers may have to be used to achieve the level of attenuation desired. The plurality of EBG layers, as compared to a single EBG layer, reduce reliability and increase cost of the hybrid.

SUMMARY OF THE INVENTION

Above limitations are improved by a hybrid assembly comprising a single electromagnetic band gap (EBG) layer on a substrate having an upper surface and a lower surface and a semiconductor structure (MMIC) mounted above the EBG layer. The hybrid operates typically at microwave operating frequencies. Conductive paths are etched on the upper surface for conducting high frequency signals along the upper surface of the substrate.

A plurality of stars made of an EBG material, forming the EBG layer, are preferably printed, or deposited, on the upper surface. The EBG material has slow wave characteristics. The plurality of stars tessellates the upper surface between the conductive paths, generally in an area below the semiconductor structures.

Each of the stars has a center section formed from a regular polygon, the center section having projections extending from the center section. The projections and the center section form a periphery. The periphery engages adjacent stars along the periphery. Stars are separated from adjacent stars by an interspace. The interspace is preferably constant along the periphery. Stars are also separated by a distance from the conductive paths. Each of the stars is connected to a conductive via, in turn connected to ground potential. In one embodiment, the lower surface is covered with a conductive layer at ground potential. This conductive layer is electrically continuous with vias used to interconnect all stars forming the EBG layer.

DETAILED DESCRIPTION

The present invention describes an apparatus and method for improved cross talk suppression in a hybrid assembly by incorporating a single layer made of electromagnetic band-gap (EBG) stars on a hybrid substrate such as, for example, alumina, LTCC (low temperature co-fired ceramic) as well as HTCC (high temperature co-fired ceranic).

The EBG stars reduce the cross talk induced by undesired surface/waveguide modes at high operating frequencies (10 to 20 Ghz) between input/output and power (or ground) pins on the operation of the hybrid.

Figure 1:
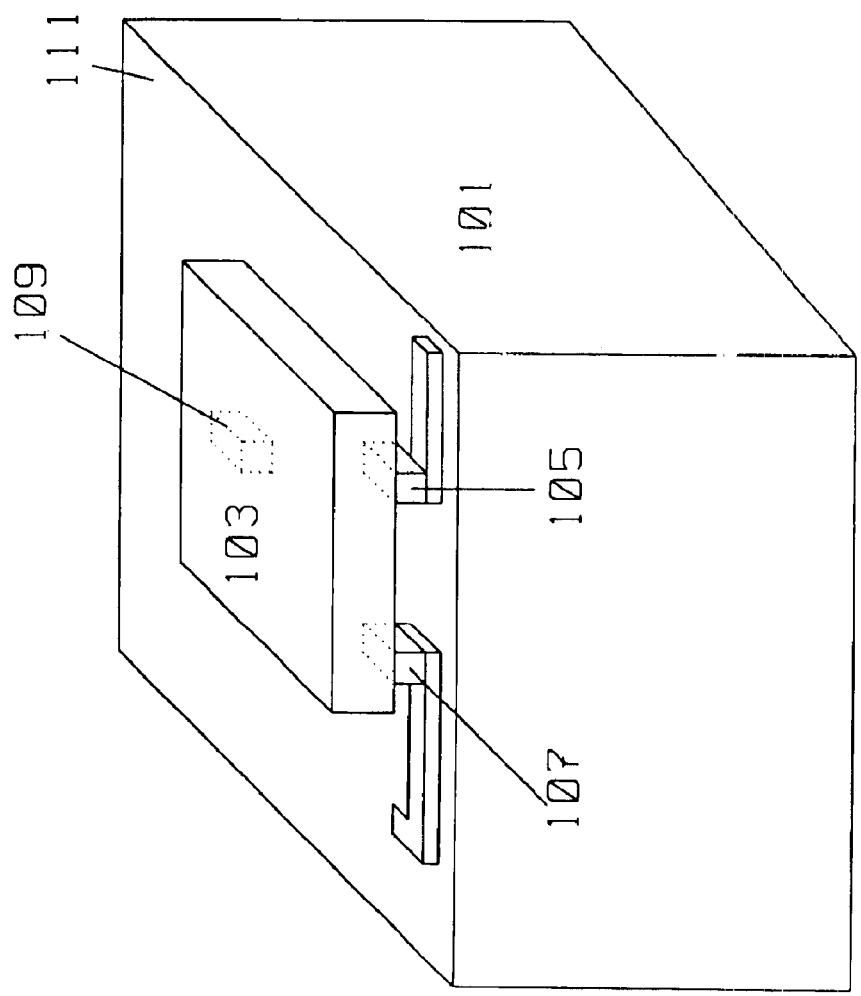
FIG. 1 is a typical configuration of the prior art where a semiconductor structure is mounted on a substrate using bumps for inter connection means.

FIG. 1 is a typical configuration of a hybrid of the prior art where a semiconductor structure 103 is mounted on the upper surface 111 of a host substrate 101 using bumps 105, 107 and 109 for inter-connection means. Substrate 101 has an upper metalization layer deposited on upper surface 111 of substrate 101. Conductive paths 113 and 115 are etched from a metalization layer, and interconnect bumps 105,107 and 109 to their respective signal, ground or power sources. In turn, bumps 105, 107, and 109 form a continuous electrical path with pads (not shown) located on semiconductor structure 103, thus proving a path for conductively transferring the signal, ground or power from pads 105, 107 and 109 to specific locations within semiconductor structure 103. An example of a semiconductor structure is a Monolithic Integrated Circuit, MMIC. The MMIC typically may comprise semiconductors, capacitors and resistors, as is well known in the art.

In the configuration of FIG. 1, at high frequencies (10 to 20 Ghz), signals propagate along the upper surface 111 of substrate 101. Upper surface 111 forms a waveguide like configuration with semiconductor structure 103. This waveguide like path tends to undesirably propagate high frequency signals from their intended destination. One mechanism for this undesired propagation are surface/waveguide modes along the interface of upper surface 111 of substrate 101 and semiconductor structure 109. For example, a signal meant for bump 105 may also be transmitted via surface/waveguide modes to an unintended point along upper surface 111, such as bump 107. Thus some of the signal present at bump 105 will also undesirably appear at bump 107 causing cross talk, interference thereby degrading hybrid operation. Bump 109 is similarly susceptible to high frequency signals from bump 107.

Figure 2:
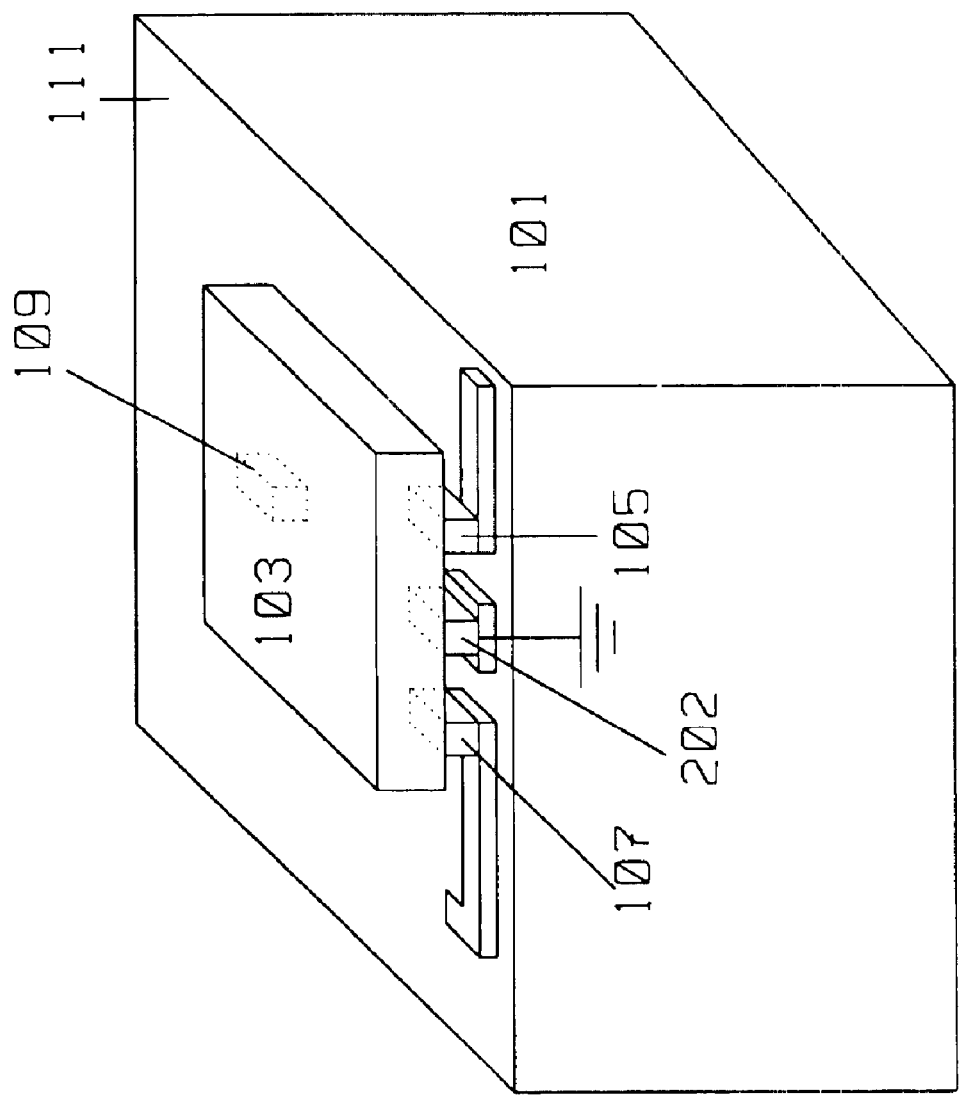
FIG. 2 is a typical configuration of the prior art where a redundant bump is used to minimize the undesired propagation of surface waves along an upper surface of a host substrate.

FIG. 2 shows a means of the prior art used to minimize undesired surface (waveguide mode) propagation of signals from bump 105 to bump 107. Here, bump 202 has been introduced between bump 105 and 107 to avoid or minimize undesired propagation of electromagnetic energy via surface/waveguide modes from bump 105 to bump 107. Bump 202 is grounded, and effectively reduces the space between bump 107 and bump 105, thereby attenuating surface/waveguide mode energy that may reach bump 105 from bump 107. The introduction of bump 202, while minimizing unwanted electromagnetic energy transfer from bump 105 to bump 107, forces an increase in the surface area of substrate 101 as well as the physical dimensions of semiconductor structure 103. This increases costs and, because of increased size, further exposes semiconductor structure 103 to the reception of other, interfering electromagnetic energy. Furthermore, bump 202 does little to alleviate cross talk effects to bump 109.

Figure 3:
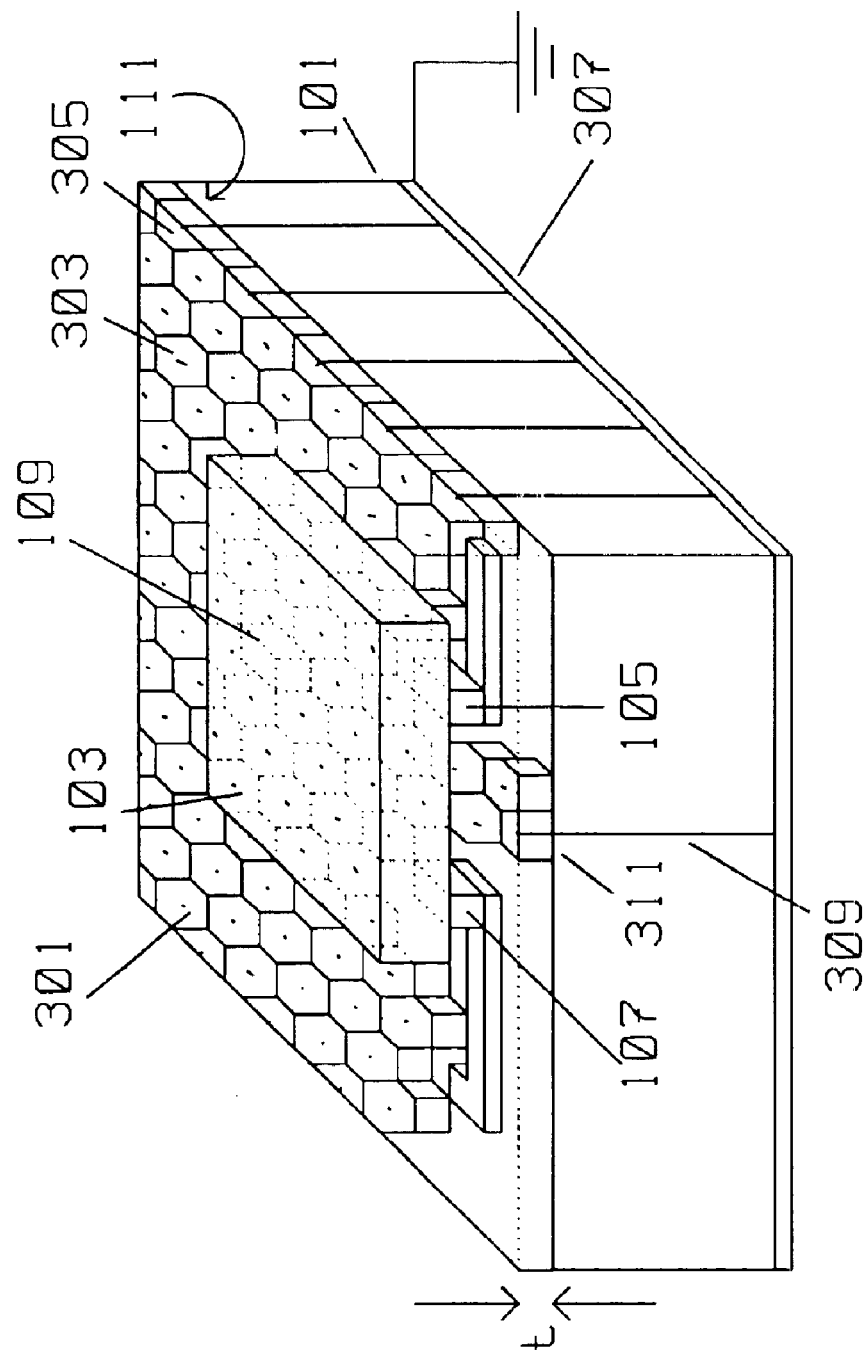
FIG. 3 is a typical configuration described in the parent application using EBG layers for minimizing undesired propagation of surface waves, where regular polygons tessellate an upper surface of a substrate located under a semiconductor structure.

FIG. 3 shows an improvement over FIG. 2 as described in the parent application. A periodic electromagnetic band-gap, EBG (sometimes referred to as photonic bandgap, PBG), lattice structure made of hexagons (regular polygons) exhibiting stopband and slow wave characteristics tessellates upper surface 111 of substrate 101 between signal bumps such as 105, 107 and 109. The hexagons are at a distance from and electrically separate from signal bumps such as, for example, 105, 107 and 109. EBG lattice structures are used to minimize the propagation of electromagnetic energy using surface/waveguide modes in a specific frequency band of operation.

A plurality of hexagonal elements 301 form single layer EBG lattice structure 303, generally printed on substrate 101. Undesired signals traveling from bump 107 towards bump 105 now encounter the effects of the EBG lattice 303 and are attenuated. The thickness of lattice structure 303, shown as t, is, for example, in the order of 1 to 3 mils, depending on the type of ink used to print the lattice structure 303 onto substrate 101, the frequency band to be attenuated, physical dimensions of the semiconductor structure 103.

Each periodic element, or polygon of EBG layer 303, such as polygon 301 and polygon 305, is connected to ground plane 307 using a via. For example, via 309 connects polygon 311, part of EBG layer 303 to ground plane 307.

Unfortunately, a single EBG layer made of regular polygons such as hexagons typically offers limited, sometimes insufficient attenuation of undesired surface waves.

Figure 4:
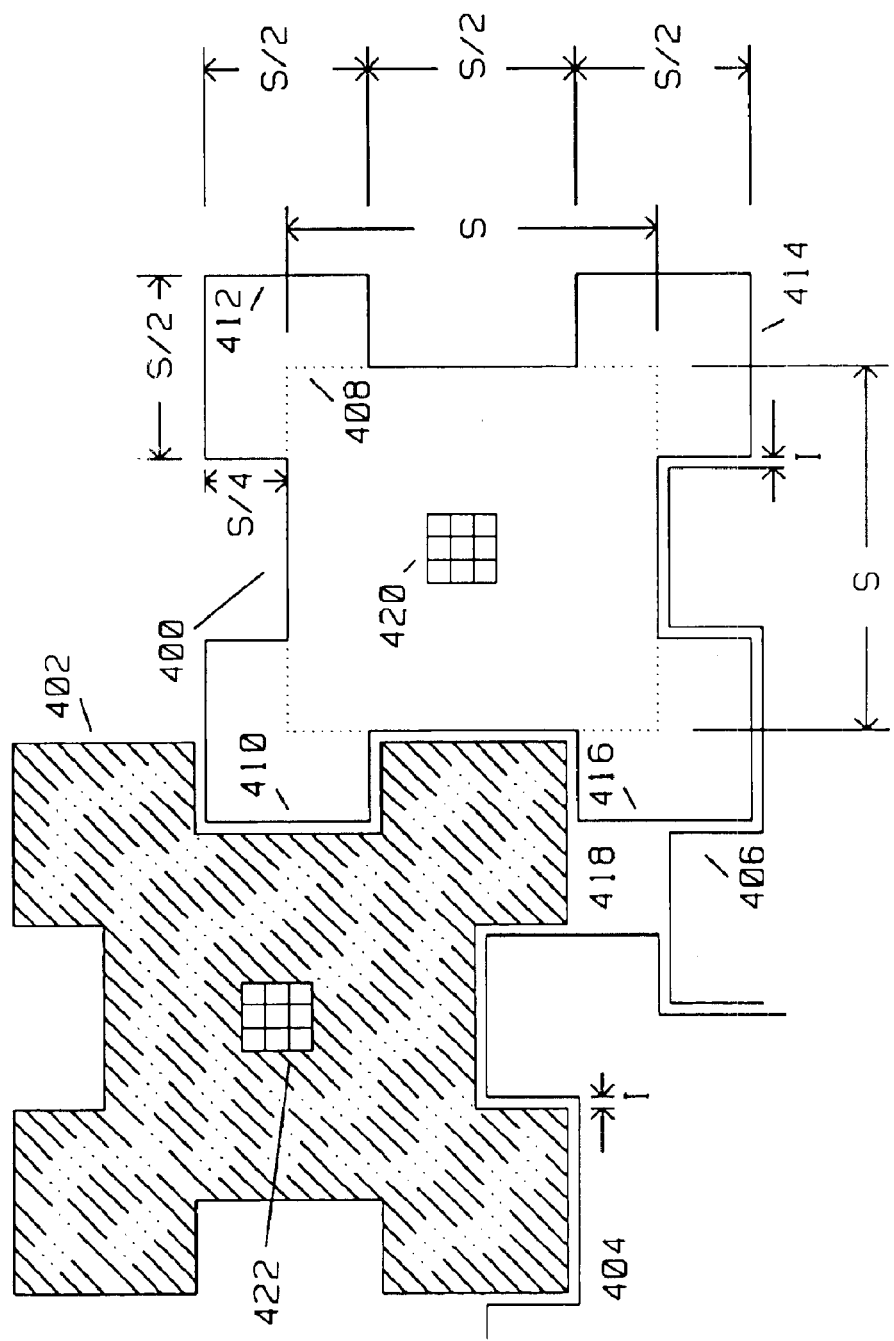
FIG. 4 is a top view of the interleaving star structure used in this invention.

FIG. 4 shows the structure of star EBG elements of the present invention used to provide additional attenuation for surface waves using a single EBG layer. Star 400 interleaves with star 402 as well as partially shown star 406. Star 402 also interleaves with partially shown star 404. The stars are interleaved with an interspace I between their respective peripheries.

Stars 400,402,404 and 406 form a window 418 between their respective peripheries. This window 418 is used to accommodate vias passing through the plane of stars 400, 402, 404 and 406.

Figure 6:
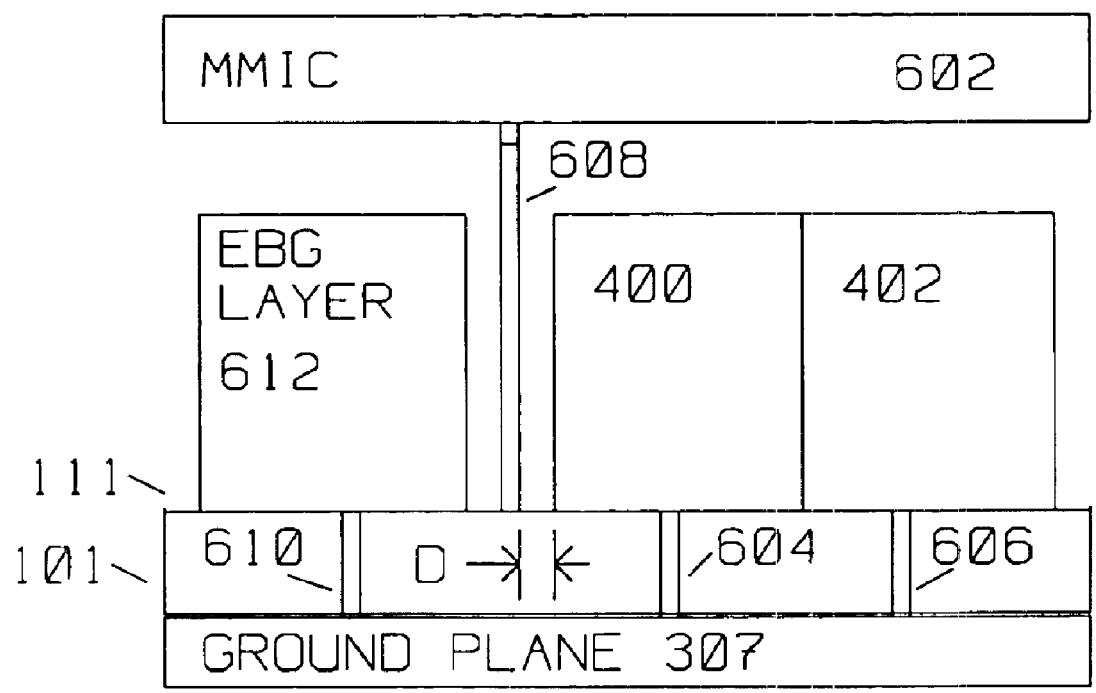
FIG. 6 is a cross section of an exemplary configuration of a hybrid of the present invention having EBG stars of FIGS. 4 and 5 used to tessellate the upper surface of a substrate for minimizing undesired propagation of surface waves.

Star 402 has a center via 422 traversing the substrate and connecting to ground potential as shown in FIG. 6. Similarly, star 400 has a center via 420 traversing the substrate and connecting star 400 to ground potential.

A plurality of stars such as 400 and 402 are made of an electromagnetic band gap material on upper surface 111, the electromagnetic band gap material having slow wave characteristics. The plurality of stars tessellate upper surface 111 between conductive paths.

Each of stars such as 400 and 402 have a center section formed from a regular polygon. The center section has projections extending from the center section. The projections on the center section form a periphery. The periphery of each star engages the periphery of adjacent stars along their respective peripheries. The peripheries of adjacent stars are separated from each other by an interspace I.

The polygon, for example a square 408 in FIG. 4, is surrounded by projections, such as four smaller squares, 410, 412, 414, and 416. If the dimension of the side of square 408 is S, then the dimension of the side of the smaller squares 410, 412, 414, and 416 is approximately S/2. The four smaller squares 410, 412, 414, and 416 are centered with respect to the corners of the large square 408. In a preferred embodiment, the centers of stars tessellating upper surface 111, such as star 400 and star 402, are regularly positioned on an approximate staggered rectangular grid of dimension 5S/4 by 5S/4, with a stagger of S/2, as detailed in FIG. 5.

Interspace I can be accommodated by reducing the side S of the large square 408 forming star 400, increasing the distance between the center of stars 400 and 402, or both. Also the size of smaller squares needs to be reduced to allow for interspace I as shown. The width of interspace I is meant to be constant over the peripheries of all stars. I is chosen to be compatible with the operating band of the hybrid, the degree of attenuation desired, and the type of EBG material used. Typically, I will become smaller as the frequency of operation of the hybrid increases.

Figure 5:
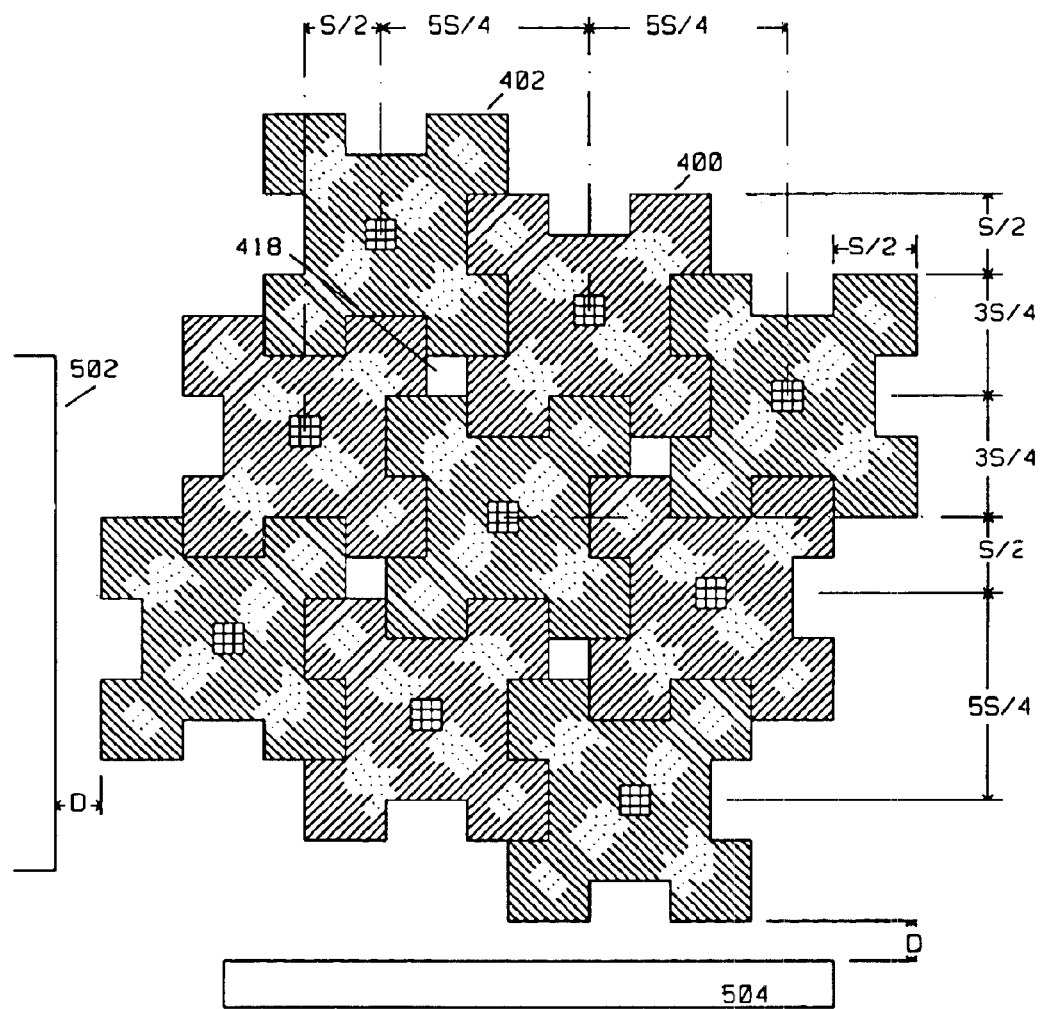
FIG. 5 shows the top view of the interleaving of a plurality of stars of the present invention to tessellate an upper surface of a substrate.

The tessellation of stars shown in FIG. 5 is separated by a distance D from conductive paths such as conductive path 502 and conductive path 504.

For example, in FIG. 6, the distance D separates star 400 from the vertical surface of bump 608 and its associated conductive path, not shown. Each of the stars is connected to a conductive via. For example star 400 is connected to via 604, while star 402 is connected to via 606. Each elements of EBG layer 612, formed from stars similar to star 400 and star 402, is connected to groundplane 307 using a typical via 610.

Conductive via 604 and 606 are connected to ground potential, ground plane 307. Typically, a plurality of stars interdigitated as shown in FIG. 5 tessellate the upper surface of the substrate between conductive paths. The stars are typically positioned below a semiconductor structure, such as MMIC 602, forming an EBG layer 612. Without the presence of stars such as 400 and 402, typically surface modes are present at the substrate interface in the vicinity of MMIC 602. For an alumina substrate for example, the presence of these surface modes (leakage energy) is more pronounced near 19 GHz, and more dominant between the Alumina substrate and flip chip MMIC interface of MMIC 602. The afield intensity has been found to be strongest directly above and directly inside the Alumina substrate interface.

METHOD

The method for manufacturing the hybrid assembly of this invention comprises the steps of:

a) forming conductive paths, connected for example to bump 608, for conducting high frequency signals along an upper surface 111 of substrate 101;

b) forming stars, the stars made from an electromagnetic band gap material on said upper surface 111. This forms the EBG layer 612, and stars such as 400 and 402. The electromagnetic band gap (EBG) layer 612 has slow wave characteristics in a particular band related to the operating frequency of the hybrid. EBG layer 612 is formed as a lattice for tessellating said upper surface 111;

c) mounting MMIC 602 above EBG layer 612 and connecting MMIC 602 using structures such as bump 608 for input and output signals, power and ground.

A star such as 400 or 402 is formed from a polygonal center section (e.g. a first square 408) with projections extending from it. This first square has four equal first sides, each of the four first sides meeting at a ninety degree angle with the the next first side to form first four corners, each of the four first sides having a first length S.

The projections extending from said center section are four second squares, 410, 412, 414 and 416. Each of said second squares have four second sides, each of said second sides one half of said first length, S/2. Each of said second sides meet at a ninety degree angle with the next second side to form four second corners. The four second squares are centered on the first four corners of first square 408.

The first length chosen for the dimension of the first square is inversely proporional to the operating frequency of said hybrid. Similarly, the interspace I between stars along the periphery is inversely proportional to the operating frequency of the hybrid.

The semiconductor structures (MMIC 602) are typically mounted over, or in near vertical proximity, to the stars. The semiconductor structures have a plurality of electrical contacts with said conductive paths.

Vias, such as via 604 and via 606, connect stars such as 400 and 402 respectively to a ground potential. Typically, the vias traverse substrate 101 and connect to a conductive layer, ground plane 307 on the lower surface of substrate 101.

Conveniently, the intersection of four stars forms a window 418 between the four intersecting stars, providing a location for vertical structures, such as bump 608 to pass without electrically connecting to EBG layer 612, or stars such as 400 and 402 part of EBG layer 612.

All references cited in this document are incorporated herein in their entirety by reference.

Although presented in exemplary fashion employing specific embodiments, the disclosed structures are not intended to be so limited. For example, although polygon examples are squares, other polygons, such as triangles can be used to form stars for periodic lattices for tessellating substrate surface 111.

Those skilled in the art will also appreciate that numerous changes and modifications could be made to the embodiment described herein without departing in any way from the invention.

What is claimed is:

1. A hybrid assembly operating at an operating frequency comprising:
    a substrate having an upper surface and a lower surface;
    conductive paths on said upper surface for conducting high frequency signals along said upper surface of said substrate;
    a plurality of stars made of an electromagnetic band gap material on said upper surface, said electromagnetic band gap material having slow wave characteristics, said plurality of stars tessellating said upper surface between said conductive paths,
    each of said stars having a center section formed from a regular polygon, said center section having projections extending from said center section, said projections and said center section forming a periphery, said periphery engaging adjacent stars along said periphery and separated from said adjacent stars by an interspace,
    said stars separated by a distance from said conductive paths; each of said stars connected to a conductive via, said conductive via connected to ground potential.

2. A hybrid assembly as in claim 1 wherein said center section is a first square, said first square having four equal first sides, each of said four first sides meeting at a ninety degree angle with the next first side to form first four corners, each of said four first sides having a first length.

3. A hybrid assembly as in claim 2 wherein said projections extending from said center section are four second squares, each of said second squares having four second sides, each of said second sides one half of said first length, each of said second sides meeting at a ninety degree angle with the next second side to form four second corners.

4. A hybrid assembly as in claim 3 wherein said four second squares are centered on said first four corners of said first square.

5. A hybrid assembly as in claim 4 wherein said first length is inversely proportional to said operating frequency of said hybrid.

6. A hybrid assembly as in claim 5 wherein said interspace along said periphery is inversely proportional to said operating frequency of said hybrid.

7. A hybrid assembly as in claim 6 wherein semiconductor structures are mounted over said stars, said semiconductor structures having a plurality of electrical contacts with said conductive paths.

8. A hybrid assembly as described in claim 7 wherein said vias connecting said stars to said ground potential traverse said substrate and connect to a conductive layer on said lower surface of said substrate.

9. A hybrid assembly as described in claim 8 wherein the intersection of four of said stars forms a window between said four intersecting stars.

10. A hybrid assembly as described in claim 9 wherein interconnecting means to semiconductor structures mounted over said stars pass within said window without electrical contact to said stars.

11. A method for manufacturing a hybrid assembly operating at an operating frequency comprising the steps of:
    etching conductive paths on an upper surface of a substrate for conducting high frequency signals along said upper surface of said substrate;
    printing a plurality of stars made of an electromagnetic band gap material on said upper surface, said electromagnetic band gap material having slow wave characteristics, said plurality of stars tessellating said upper surface between said conductive paths, each of said stars having a center section formed from a regular polygon, said center section having projections extending from said center section, said projections and said center section forming a periphery, said periphery engaging adjacent stars along said periphery and separated from said adjacent stars by an interspace, said stars separated by a distance from said conductive paths; each of said stars connected to a conductive via, said conductive via connected to ground potential.

12. A method as in claim 11 wherein said polygonal center section is a first square, said first square having four equal first sides, each of said four first sides meeting at a ninety degree angle with the the next first side to form first four corners, each of said four first sides having a first length.

13. A method as in claim 12 wherein said projections extending from said first center section are four second squares, each of said second squares having four second sides, each of said second sides one half of said first length, each of said second sides meeting at a ninety degree angle with the next second side to form four second corners.

14. A method as in claim 13 wherein said four second squares are centered on said first four corners of said first square.

15. A method as in claim 14 wherein said first length is inversely proportional to said operating frequency of said hybrid.

16. A method as in claim 15 wherein said interspace along said periphery is inversely proportional to said operating frequency of said hybrid.

17. A method as in claim 16 wherein semiconductor structures are mounted over said stars, said semiconductor structures having a plurality of electrical contacts with said conductive paths.

18. A method as described in claim 17 wherein said vias connecting said stars to said ground potential traverse said substrate and connect to a conductive layer on a lower surface of said substrate.

19. A method as described in claim 18 wherein the intersection of four of said stars forms a window between said four intersecting stars.

20. A method as described in claim 19 wherein interconnecting means to semi-conductor structures mounted over said stars pass within said window without electrical contact to said stars.

* * * * *